(12) United States Patent
Choi

(10) Patent No.: US 9,640,587 B2
(45) Date of Patent: May 2, 2017

(54) SEMICONDUCTOR INTEGRATED CIRCUIT DEVICE HAVING VERTICAL CHANNEL AND METHOD OF MANUFACTURING THE SAME

(71) Applicant: SK hynix Inc., Gyeonggi-do (KR)

(72) Inventor: Kang Sik Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/217,727

(22) Filed: Jul. 22, 2016

(65) Prior Publication Data

US 2016/0336376 A1 Nov. 17, 2016

Related U.S. Application Data

(62) Division of application No. 14/518,813, filed on Oct. 20, 2014, now Pat. No. 9,425,282.

(30) Foreign Application Priority Data

Jul. 9, 2014 (KR) .......................... 10-2014-0086098

(51) Int. Cl.
| | |
|---|---|
| *H01L 29/423* | (2006.01) |
| *H01L 27/24* | (2006.01) |
| *H01L 29/66* | (2006.01) |
| *H01L 29/78* | (2006.01) |
| *H01L 45/00* | (2006.01) |
| *H01L 29/786* | (2006.01) |

(52) U.S. Cl.
CPC .... *H01L 27/2454* (2013.01); *H01L 29/42392* (2013.01); *H01L 29/66492* (2013.01); *H01L 29/66666* (2013.01); *H01L 29/7827* (2013.01); *H01L 29/78621* (2013.01); *H01L 29/78642* (2013.01); *H01L 45/04* (2013.01); *H01L 45/06* (2013.01); *H01L 45/16* (2013.01)

(58) Field of Classification Search
CPC . H01L 51/5237; H05K 5/0017; H05K 5/0234
USPC ........................................................ 257/329
See application file for complete search history.

(56) References Cited

U.S. PATENT DOCUMENTS

2011/0073925 A1*  3/2011  Park .................. H01L 21/28518
                                                          257/306

FOREIGN PATENT DOCUMENTS

| KR | 100673012 B1 * | 1/2007 | ........... H01L 27/108 |
| KR | 1020110019129 A * | 2/2011 | ........... H01L 21/336 |

* cited by examiner

*Primary Examiner* — Andy Huynh
(74) *Attorney, Agent, or Firm* — I P & T Group LLP

(57) ABSTRACT

A semiconductor integrated circuit device having a vertical channel and a method of manufacturing the same are provided. A plurality of active lines are formed in a semiconductor substrate. A gate electrode having a lower height than each active line is formed on a sidewall of the active line. A first insulating layer having a height lower than that of the active line and higher than that of the gate electrode is buried between active lines, and a silicide layer is formed on an exposed upper surface and a lateral surface of the active line.

6 Claims, 19 Drawing Sheets

SEMICONDUCTOR INTEGRATED CIRCUIT DEVICE HAVING VERTICAL CHANNEL AND METHOD OF MANUFACTURING THE SAME

CROSS-REFERENCES TO RELATED APPLICATION

This application is a division of U.S. patent application Ser. No. 14/518,813 filed on Oct. 20, 2014, which claims priority under 35 U.S.C. 119(a) of Korean application No. 10-2014-0086098, filed on Jul. 9, 2014. The disclosure of each of the foregoing application is incorporated herein by reference in its entirety.

BACKGROUND

1. Technical Field

Embodiments relate to a semiconductor integrated circuit device having a vertical channel and a method of manufacturing the same, and more particularly, to a semiconductor integrated circuit device having a vertical channel of a wrap-around contact structure and a method of manufacturing the same.

2. Related Art

Memory devices are generally provided as internal semiconductor integrated circuit devices of computers or other electronic apparatuses. As is well-known, typical examples of memory devices include random access memories (RAMs), read only memories (ROMs), dynamic RAMs (DRAMs), synchronous DRAM (SDRAM), flash memories, and variable resistive memory devices. Variable resistive memory devices may include programmable conductive memory devices, resistive RAMs (ReRAMs), and phase-change RAMs (PCRAMs).

Nonvolatile memory devices such as PCRAMs may be used in broad electronic applications to provide high integration density, high reliability, and low power consumption.

A variable resistive memory device is one example of the nonvolatile memory device. The variable resistive memory device may include a plurality of memory cells arranged in a matrix form. The memory cell may include an access device such as a diode, a field effect transistor (FET), or a bipolar junction transistor (BJT), and may be coupled to a word line which is arranged along a row of an array. Memory elements in the memory cells may be coupled to a bit line which is arranged along a column of the array. The access device of the memory cell may select a word line coupled to a gate in a given memory cell and the given memory cell may be accessed through a row decoder which activates the row to which the given memory cell is coupled.

Currently, a transistor having a 3D vertical channel structure is preferred as the access device of the memory cell due to its ability to promote high integration density. As is well-known, the transistor having the 3D vertical channel structure may include a pillar-shaped active region, a gate formed on a circumference of the active region, a drain formed in an upper portion of the active region and located at a higher level than the gate, and a source formed in a lower portion of the active region and located at a lower level than the gate. Alternatively, the source may be formed in a semiconductor substrate which is in contact with the lower portion of the active region. A heating electrode, a variable resistance layer, and a bit line are sequentially formed and they are electrically coupled to the drain of the transistor, and thus the resistive memory cell is completed.

To obtain an ohmic contact between the drain and the heating electrode, a silicide layer for an ohmic contact layer is formed between the drain and the heating electrode. Currently, endeavors for improving operation current in the variable resistive memory device continue, and thus technology for improving the contact area between the drain and the silicide layer has been suggested.

SUMMARY

According to an embodiment, there is provided a method of manufacturing a semiconductor integrated circuit device. A plurality of active lines is formed in a semiconductor substrate. A gate electrode having a lower height than each active line is formed on a sidewall of the active line. A first insulating layer having a height lower than that of the active line and higher than that of the gate electrode is buried between active lines, and a silicide layer is formed on an exposed upper surface and lateral surface of the active line.

According to an embodiment, there is provided a method of manufacturing a semiconductor integrated circuit device. A plurality of active lines are formed to extend in parallel to each other in a semiconductor substrate having a first conductivity type. A line-shaped gate electrode having a lower height than each active line is formed on a sidewall of the active line. A first insulating layer having a height higher than that of the gate electrode and lower than that of the active line is gap-filled between active lines. Impurities having a second conductivity type opposite to the first conductivity type are implanted into the active line exposed by the gate electrode and the semiconductor substrate below the active line to form a drain region in an upper portion of the active line and to form a source region in the semiconductor substrate. A silicide layer is formed to cover an upper surface of the drain region and to surround a lateral surface of the drain region, and a second insulating layer is gap-filled between the active pillars. An exposed portion of the active line is etched using a mask substantially perpendicular to the active line to define an active pillar.

According to an embodiment, there is provided a semiconductor integrated circuit device. The semiconductor integrated circuit device may include an active pillar in which a drain region is formed in an upper portion thereof and a source region is formed in a semiconductor substrate therebelow, a gate electrode formed in a double-line form to surround two facing lateral surfaces of the active pillar, and a silicide layer formed to cover an upper surface of the active pillar corresponding to the drain region and to surround lateral surfaces of the active pillar bordering the upper surface.

These and other features, aspects, and embodiments are described below in the section entitled "DETAILED DESCRIPTION".

BRIEF DESCRIPTION OF THE DRAWINGS

The above and other aspects, features and advantages of the embodiments will be more clearly understood from the following detailed description taken in conjunction with the accompanying drawings, in which:

FIGS. 1A to 11A are plan views illustrating a method of manufacturing a semiconductor integrated circuit device having a vertical channel according to an embodiment;

FIGS. 1B to 11B are cross-sectional views illustrating a method of manufacturing a semiconductor integrated circuit device taken along line b-b' of FIGS. 1A to 11A, respectively;

FIGS. 1C to 11C are cross-sectional views illustrating a method of manufacturing a semiconductor integrated circuit device taken along line c-c' of FIGS. 1A to 11A, respectively;

FIGS. 9D to 11D are cross-sectional views illustrating a method of manufacturing a semiconductor integrated circuit device taken along line d-d' of FIGS. 9A to 11A, respectively.

DETAILED DESCRIPTION

Figure 1A:
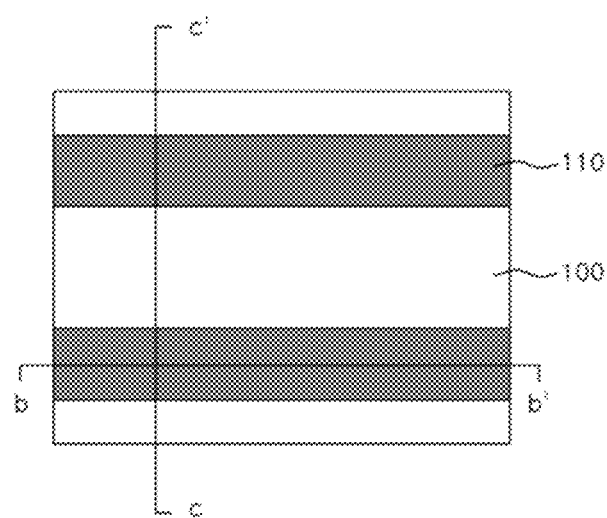

Hereinafter, exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations depending on, for example, manufacturing techniques and/or tolerances employed, are to be expected. Thus, exemplary embodiments should not be construed as limited to the particular shapes of regions illustrated herein but may include modification of shapes, etc. In the drawings, lengths and sizes of layers and regions may be exaggerated for clarity. Like reference numerals in the drawings denote like elements. It is also understood that when a layer is referred to as being "on" another layer or substrate, it can be directly on the other layer or substrate, or intervening layers may also be present.

The embodiments are described herein with reference to the cross-sectional and/or plan illustrations that are schematic illustrations of the embodiments. However, embodiments should not be construed as limiting the scope of the present invention.

Figure 1B:
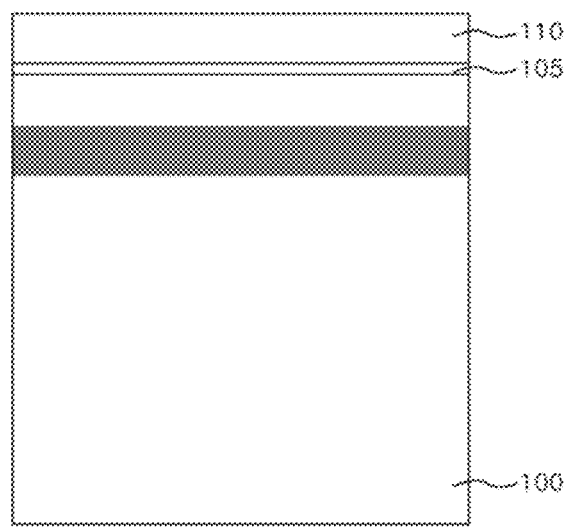
Figure 1C:
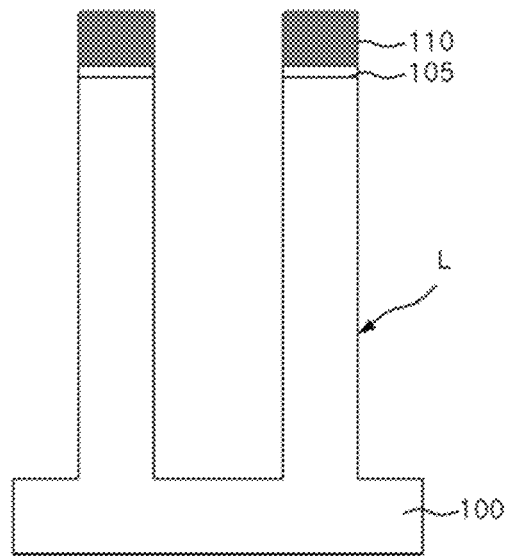

Referring to FIGS. 1A, 1B, and 1C, a pad insulating layer 105 and a hard mask layer 110 are sequentially formed on a semiconductor substrate 100. Predetermined portions of the hard mask layer 110 and the pad insulating layer 105 may be patterned to define an active region. The hard mask layer 110 is formed in a linear form, and thus the active region is defined in a linear form.

An active line L may be formed by etching the semiconductor substrate 100 to a predetermined depth using the hard mask layer 110. In an embodiment, the active line L is formed by etching the semiconductor substrate 100 to a predetermined depth, but the method of forming the active line L is not limited thereto. For example, in another embodiment, the active line L may be formed by forming an additional semiconductor layer (not shown) on the semiconductor substrate 100 and etching the semiconductor layer. Further, in an embodiment, the semiconductor substrate 100 may have a first conductivity type. The active line L may be in a linear shape which extends along a surface of the semiconductor substrate.

Figure 2A:
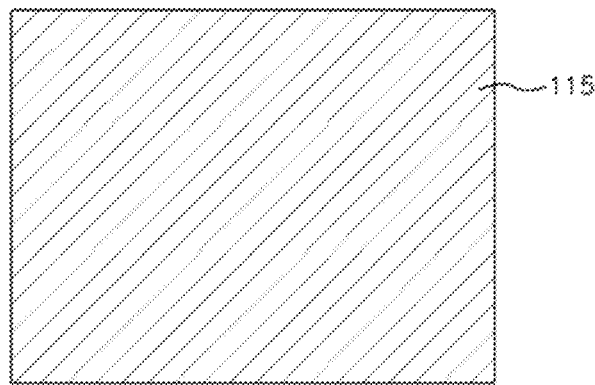
Figure 2B:
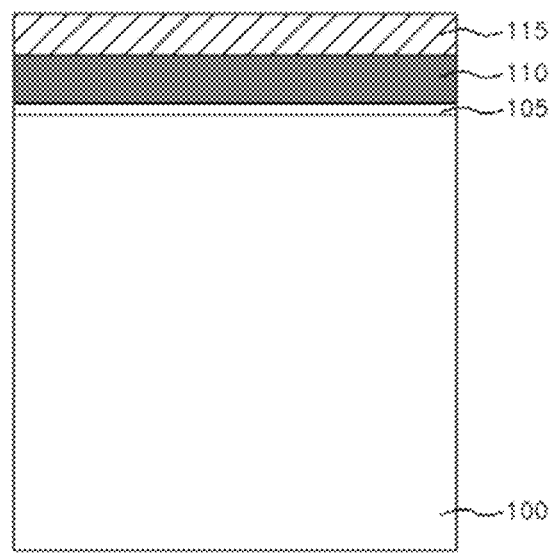
Figure 2C:
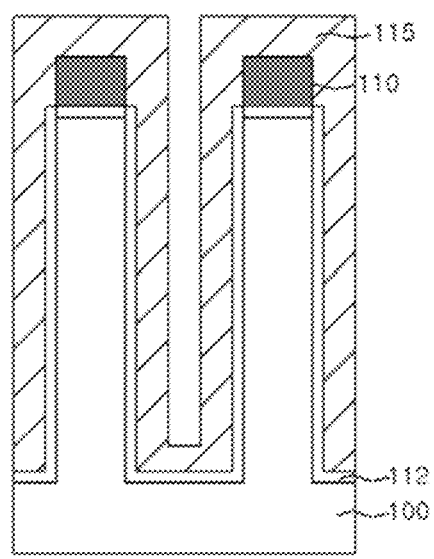

Referring to FIGS. 2A, 2B, and 2C, a gate insulating layer 112 is formed on an exposed surface of the semiconductor substrate 100 in which the active line L is formed. For example, the gate insulating layer 112 extends from over a sidewall of the active line L through over the substrate 100 to over a sidewall of a neighboring active line L. The gate insulating layer 112 may be formed, for example, through an oxidation method, but the method of forming the gate insulating layer 112 is not limited thereto. A gate conductive layer 115 is formed over the gate insulating layer 112. For example, the gate conductive layer 115 extends from over the gate insulating layer 112 which is located over the sidewall of the active line L. The gate conductive layer 115 further extends over the gate insulating layer 112 which is located over the substrate 100. The gate conductive layer 115 further extends over the gate insulating layer 112 which is located over the sidewall of the neighboring active line L. The gate conductive layer 115 may be formed to a uniform thickness.

Figure 3A:
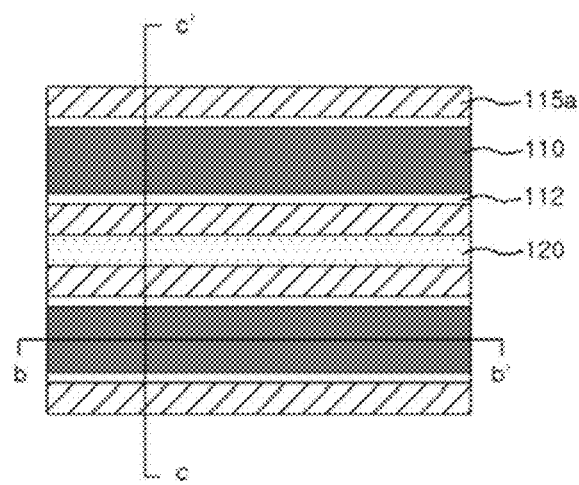
Figure 3B:
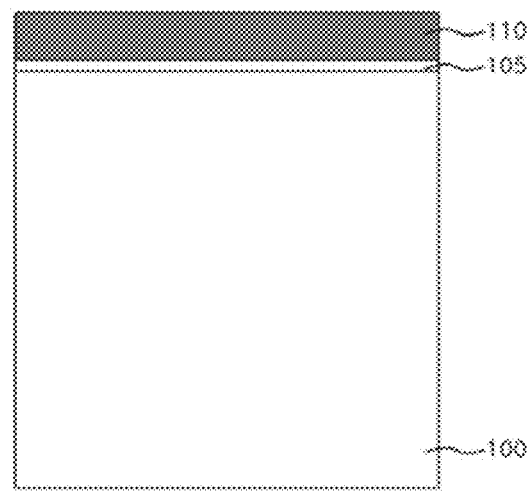
Figure 3C:
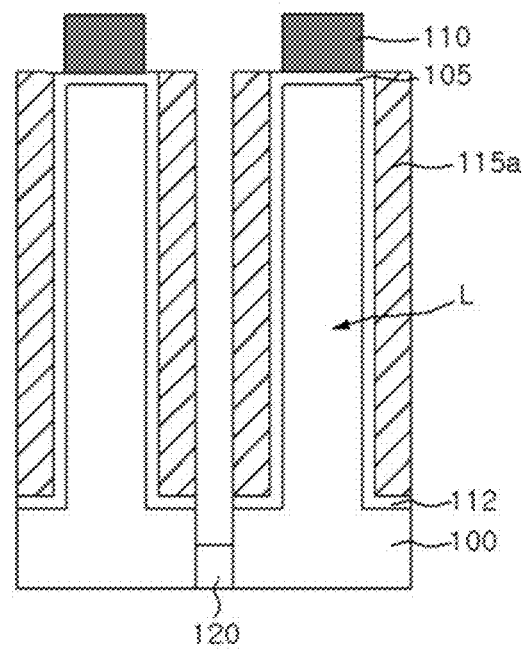

Referring to FIGS. 3A, 3B, and 3C, the gate conductive layer 115 is selectively etched and results in a preliminary gate electrode 115a which is formed over sidewalls of the active line L. The gate insulating layer 112 between the active line L and the neighboring active line L is removed to expose the substrate 100. As a result, the substrate 100 is exposed between the preliminary gate electrode 115a and a neighboring preliminary gate electrode 115a. A device isolation layer 120 is formed over the semiconductor substrate 100 which is exposed between the preliminary gate electrode 115a and the neighboring preliminary gate electrode 115a. In an embodiment, the device isolation layer 120 may include an impurity region having a second conductivity type opposite to the first conductivity type. In another embodiment, after the forming of the preliminary gate electrode 115a, the device isolation layer 120 may be formed by recessing the semiconductor substrate 100 which is exposed between the preliminary gate electrode 115a and the neighboring preliminary electrode 115a to a predetermined thickness, and implanting impurities into the semiconductor substrate. The impurity concentration of the device isolation layer 120 may be higher than source and drain regions which will be formed in a subsequent process.

Figure 4A:
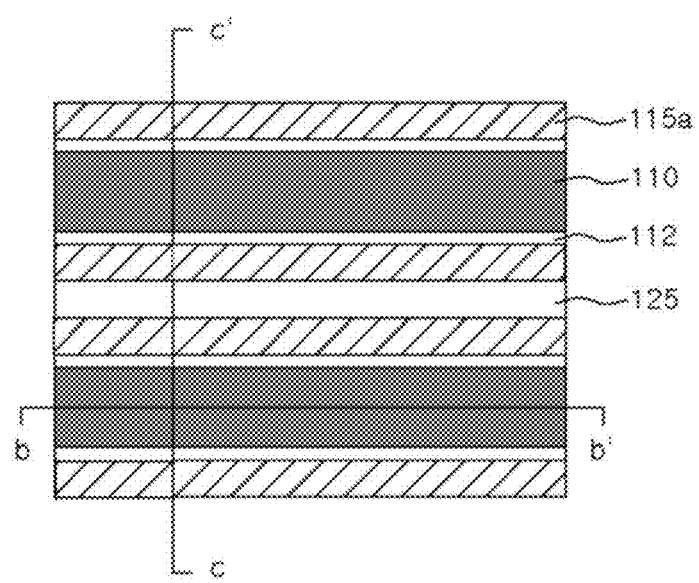
Figure 4B:
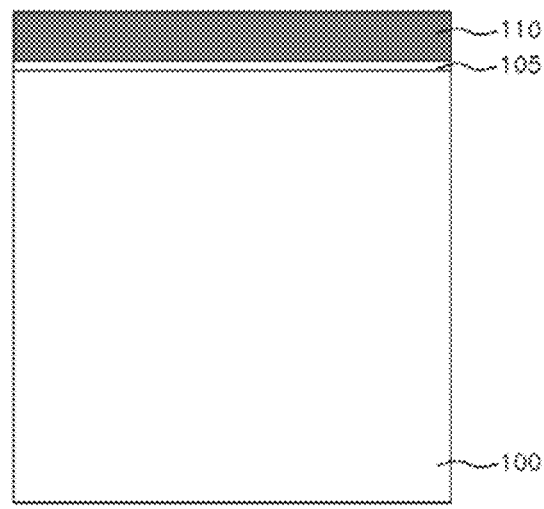
Figure 4C:
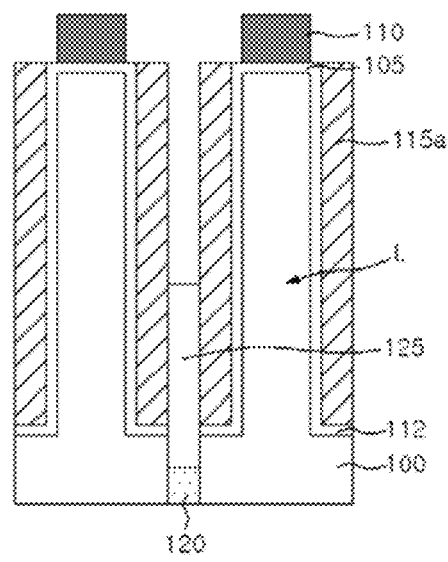

Referring to FIGS. 4A, 4B, and 4C, a first gap-fill insulating layer 125 is formed over the device isolation layer 120 and between the preliminary gate electrode 115a and a neighboring preliminary gate electrode 115a. The first gap-fill insulating layer 125 may be recessed to a predetermined thickness between the preliminary gate electrode 115a and a neighboring preliminary gate electrode 115a. A top of the first gap-fill insulating layer 125 defines a level where a top of a gate electrode, which will be formed later, is located. That is, the top of the first gap-fill insulating layer 125 may be flush with the top of the gate electrode.

Figure 5A:
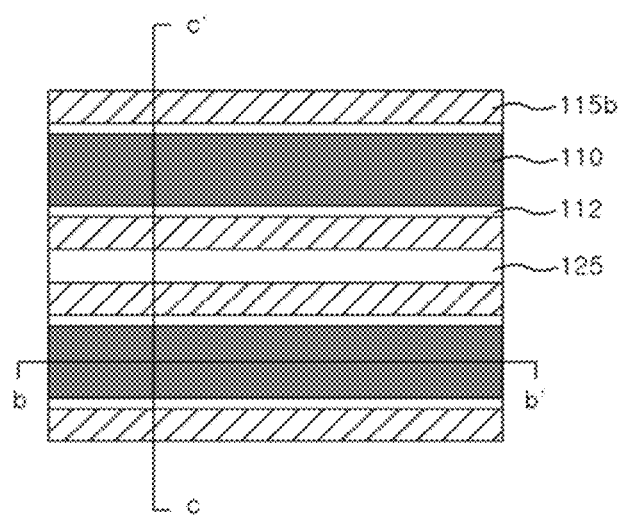
Figure 5B:
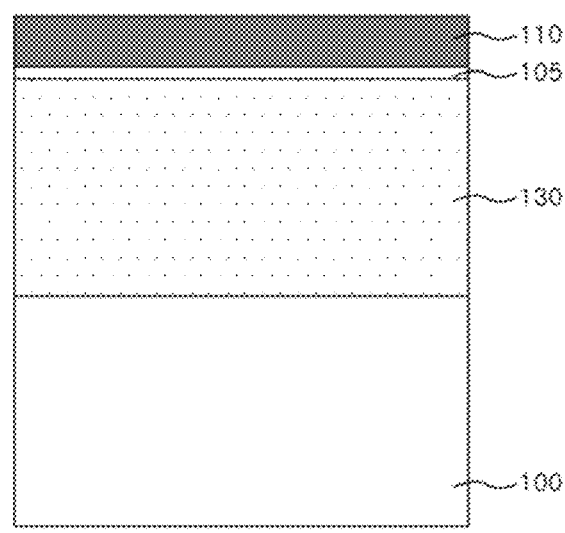
Figure 5C:
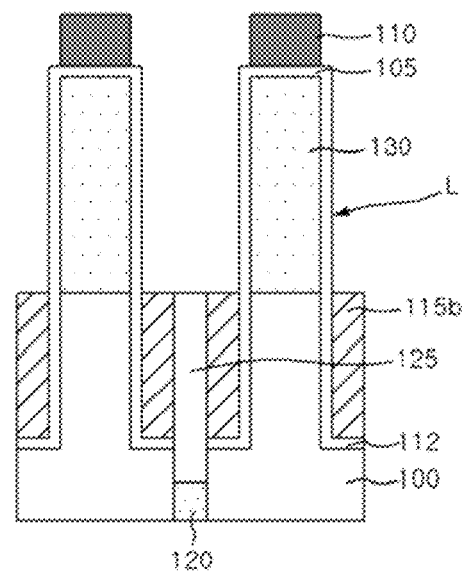

Referring to FIGS. 5A, 5B, and 5C, the preliminary gate electrode 115a is recessed to a level where the top of the first gap-fill insulating layer 125 is located, resulting in a gate electrode 115b. Subsequently, a low concentration impurity having the second conductivity type may be implanted into the active line L exposed by the gate electrode 115b to form a lightly doped drain (LDD) region 130.

Figure 6A:
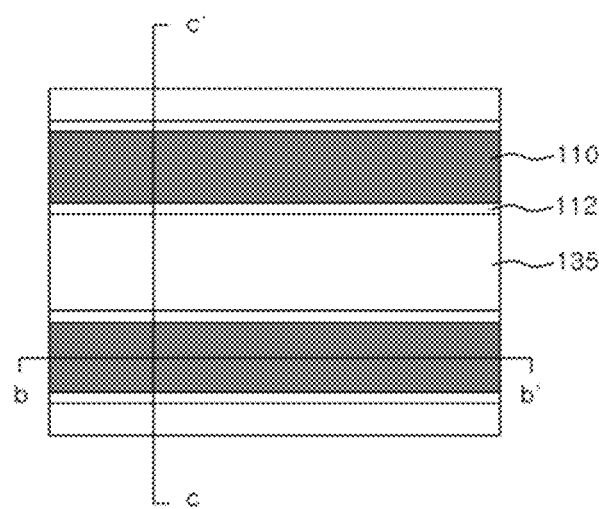
Figure 6B:
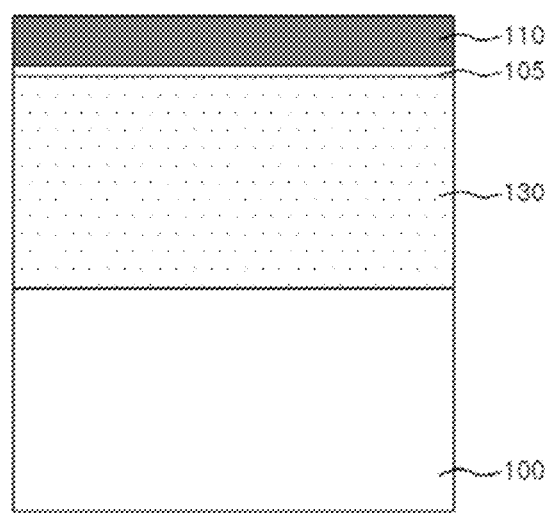
Figure 6C:
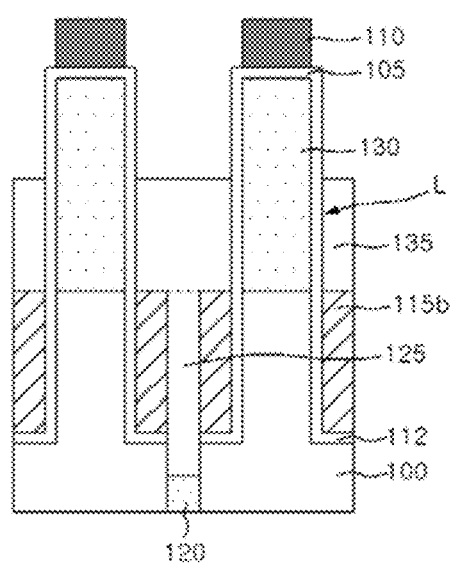

Referring to FIGS. 6A, 6B, and 6C, a second gap-fill insulating layer 135 is formed between the active lines L and over the first gap-fill insulating layer 125 and the gate electrode 115b. The second gap-fill insulating layer 135 is recessed to a predetermined thickness between the active lines L. A top of the second gap-fill insulating layer 135 may be a reference to define a bottom of a drain region, which will be formed in a subsequent process.

Figure 7A:
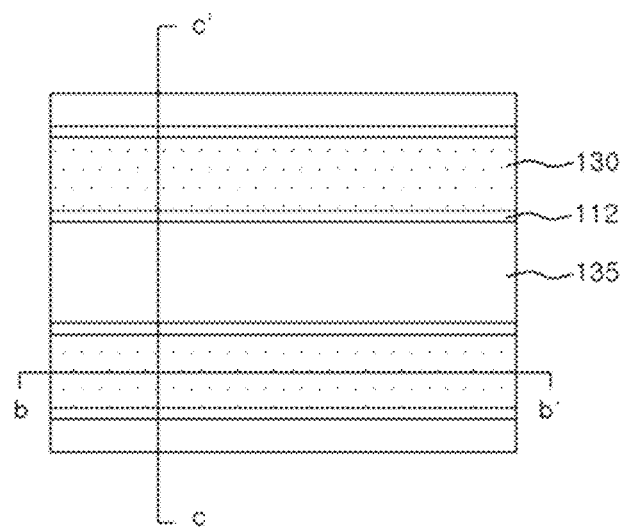
Figure 7B:
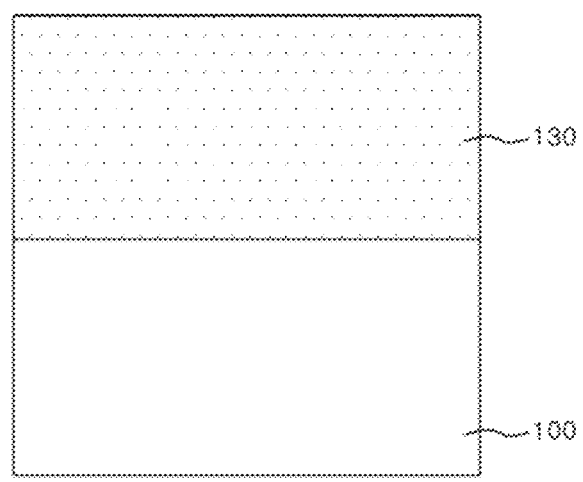
Figure 7C:
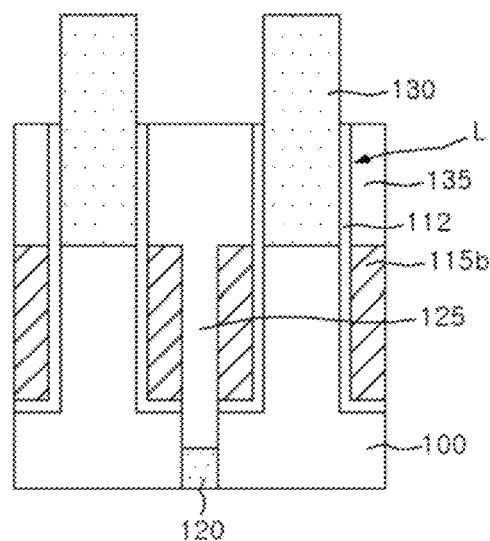

Referring to FIGS. 7A, 7B, and 7C, the exposed hard mask layer 110, pad oxide layer 105, and gate insulating layer 112 are removed to expose the active line L. For example, the hard mask layer 110, pad oxide layer 105, and gate insulating layer 112 which are located above the top of the second gap-fill insulating layer 135 are removed, exposing an upper portion of the active line L.

Figure 8A:
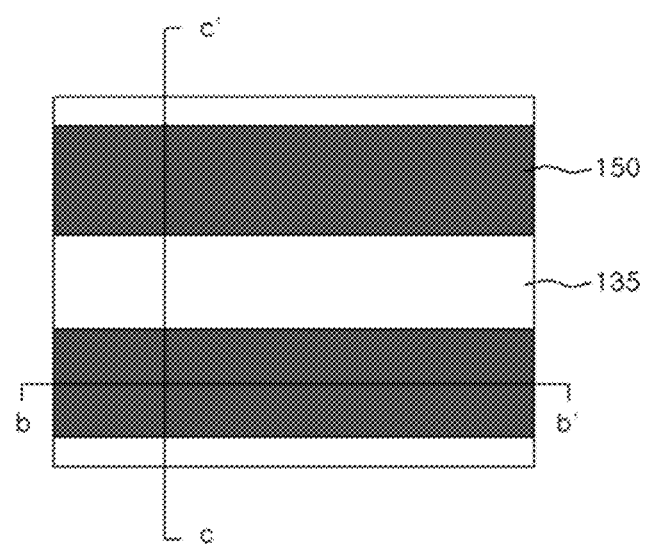
Figure 8B:
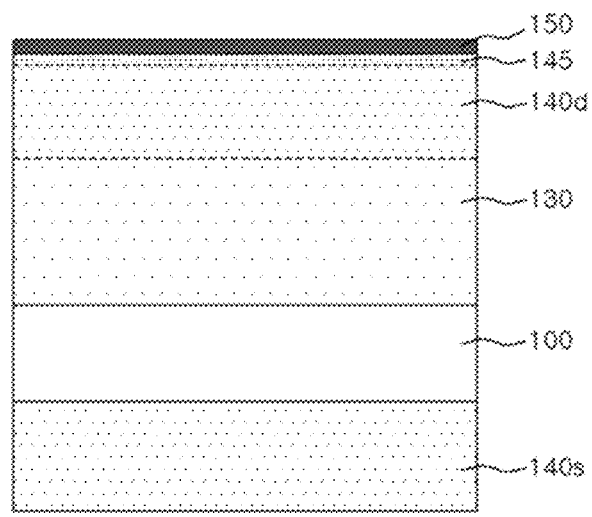
Figure 8C:
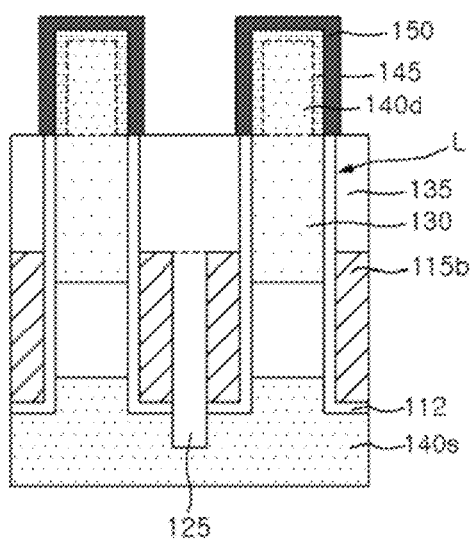
Figure 9A:
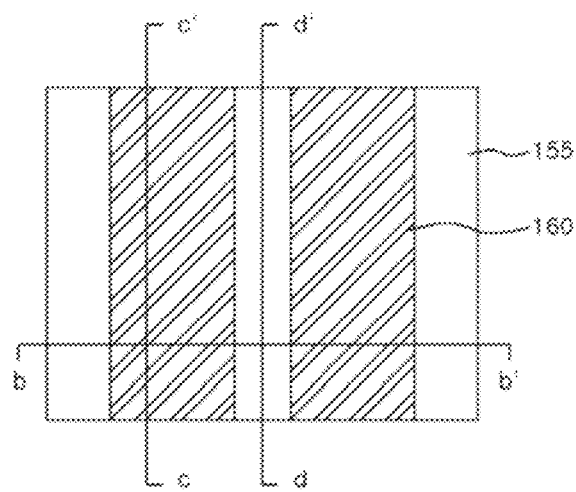
Figure 9B:
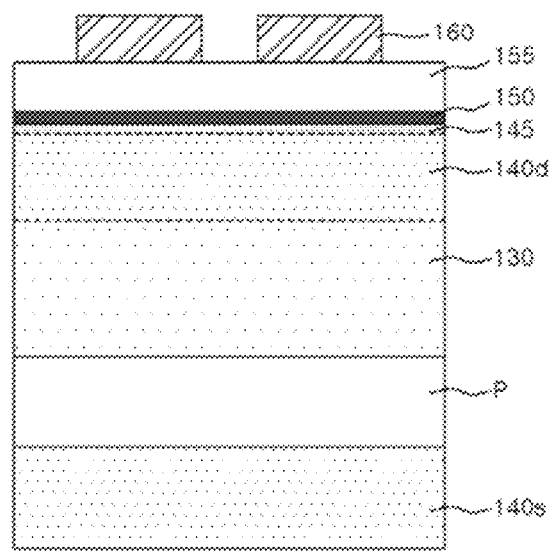
Figure 9C:
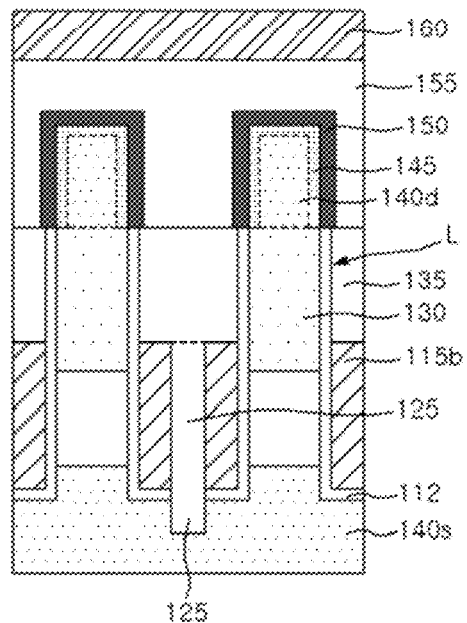
Figure 9D:
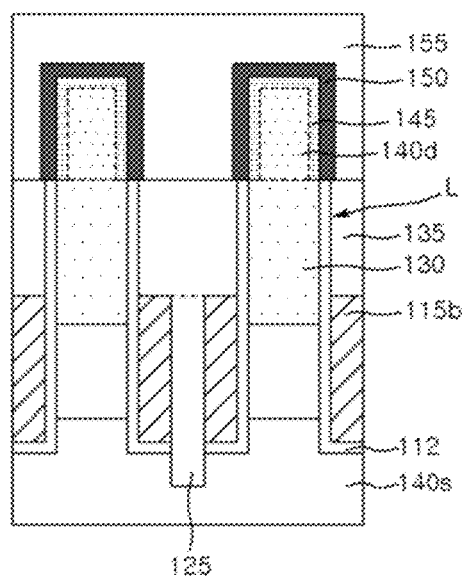
Figure 10A:
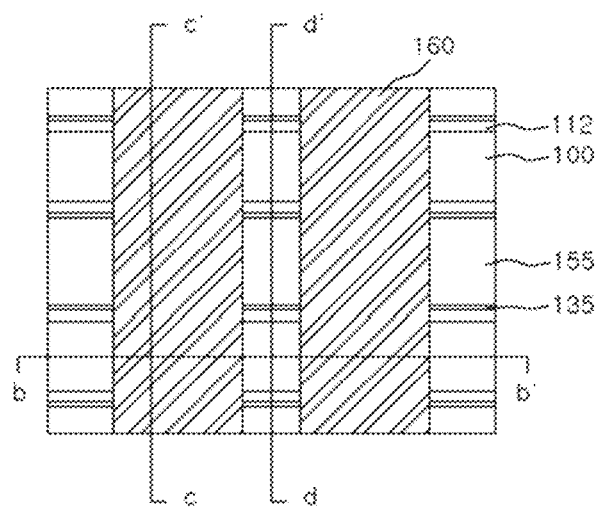
Figure 10B:
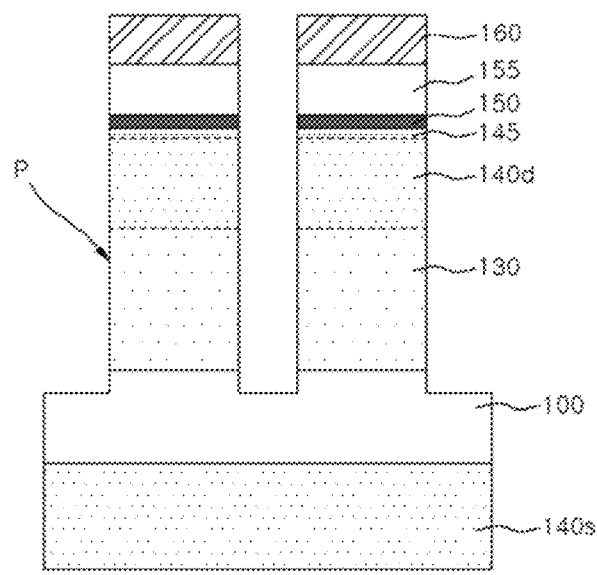
Figure 10C:
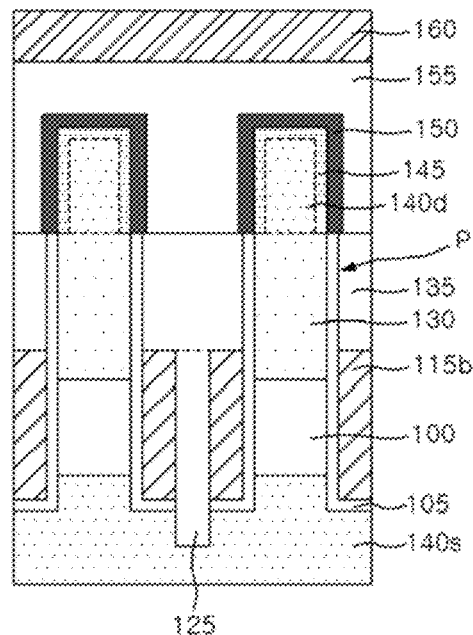
Figure 10D:
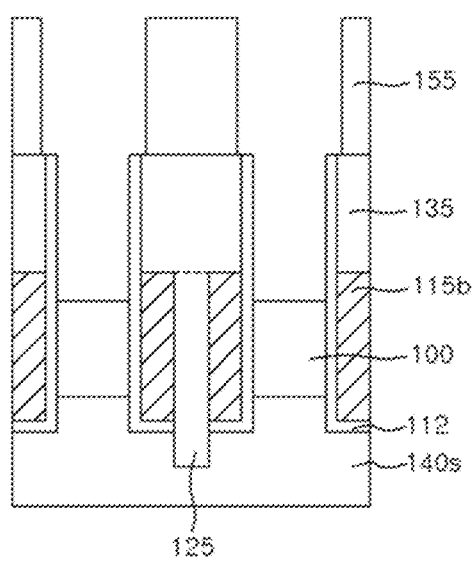
Figure 11A:
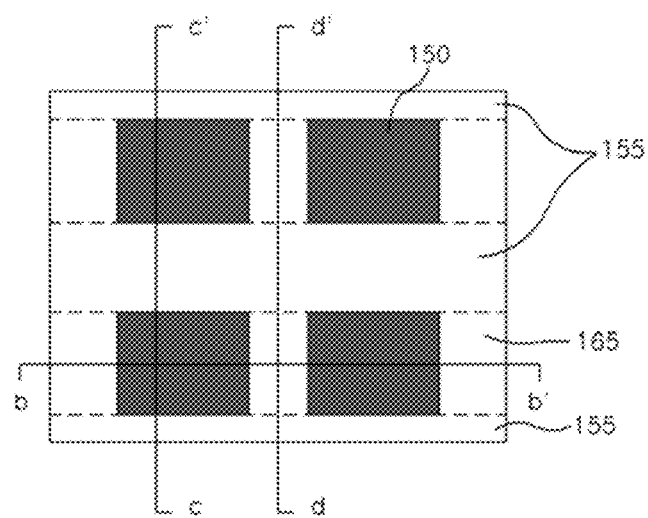
Figure 11B:
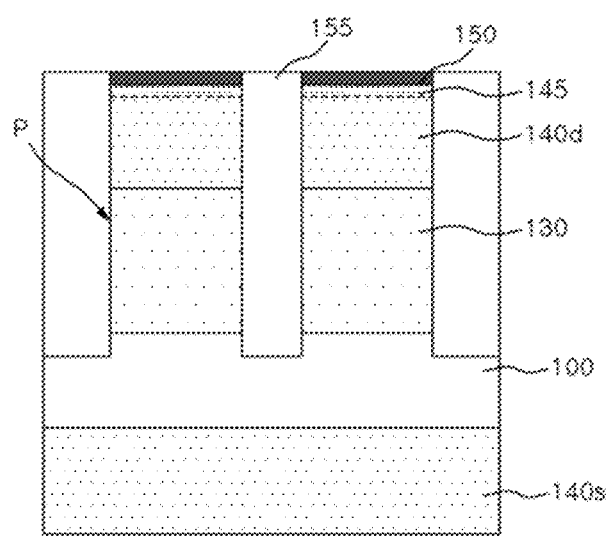
Figure 11C:
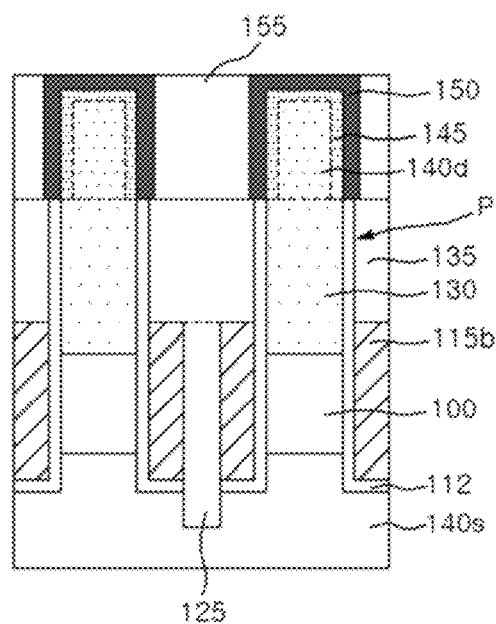
Figure 11D:
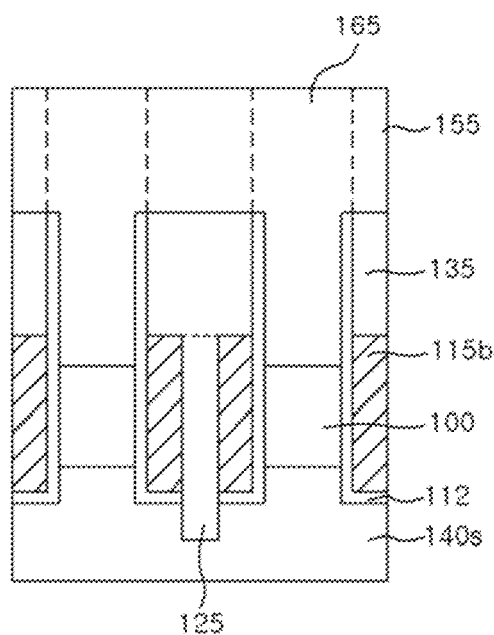

Referring to FIGS. 8A, 8B, and 8C, a high concentration of impurity having the second conductivity type is implanted into the exposed upper portion of the active line L to form a drain region 140d. A contact ion region 145 is formed along a contour of the upper portion of the active line L by implanting impurities. The contact ion region 145 is formed to a depth, which is measured from a surface of the active line L, shallower than a depth of the drain region 140d. The contact ion region 145 may be formed along a contour of the upper portion of the active line. That is, the contact ion region 145 may be in a liner shape. The contact ion region 145 may be provided to improve contact resistance between the drain region 140d and a silicide layer which will be formed later.

A silicide layer 150 is formed on a surface of the contact ion region 145. The silicide layer 150 may be formed by performing a transition metal layer deposition process and/or an activation processing process. In an embodiment, the contact ion region 145 may serve as a silicon providing layer for forming the silicide layer 150 in the course of forming the silicide layer 150.

The silicide layer 150 may be formed in a wrap-around contact form to cover an upper surface of the active line L protruding upward and surround a lateral surface of the active line L. Putting it another way, the silicide layer 150 may be formed along a contour of the upper portion of the active line and may be in a liner shape. Since the silicide layer 150 is formed on the active line L and protruding (or exposed) upward, the silicide layer may be easily formed. Further, since a separate process for defining a silicide formation region is not necessary, the process may be simplified.

The impurities included in the device isolation layer 120 may be diffused in the course of the activation process for forming the silicide layer 150. As a result, a common source region 140s which has a gradation in concentration may be formed. For example, in the common source region 140s, a concentration of impurity may gradually increases from the substrate 100 under the active line L toward the substrate 100 under the first gap-fill insulating layer 125 (i.e., the device isolation layer 120 of FIG. 7C).

The commons source region 140s is formed in the semiconductor substrate 100 and the drain region 140d is formed in the upper portion of the active line L. Then, a channel structure is formed to couple the common source region 140s to the drain region 140d. The channel structure extends in a direction substantially perpendicular to a surface of the semiconductor substrate.

Referring to FIGS. 9A, 9B, 9C, and 9D, a third gap-fill insulating layer 155 is formed between the active lines L in which the silicide layers 150 are formed. A mask pattern 160 for node separation is formed on the third gap-fill insulating layer 155. For example, the mask pattern 160 for node separation may extend in a direction substantially perpendicular to a direction in which the active line L extends when viewed in a plan view. Referring to FIGS. 10A, 10B, 10C, and 10D, the third gap-fill insulating layer 155, the silicide layer 150, the contact ion region 145, the drain region 140d, and the LDD region 130 of the exposed active line L are etched using the mask pattern 160 for node separation, and thus an active pillar P for defining an individual transistor is formed. The etch process of forming the active pillar P may be performed through an anisotropic over-etching process. The surface of the semiconductor substrate 100 may be partially etched in the over-etching process. Substantial node separation between transistors may be obtained through the formation of the active pillar P.

Referring to FIGS. 11A, 11B, 11C, and 11D, a fourth gap-fill insulating layer 165 is formed between the active pillars P. The fourth gap-fill insulating layer 165, the mask pattern 160 for node separation, and the third gap-fill insulating layer 155, which are provided over each of the active pillars L, are planarized to expose the silicide layer 150 through a chemical mechanical polishing (CMP) process, and thus the active pillars P are insulated from each other.

Figure 12:
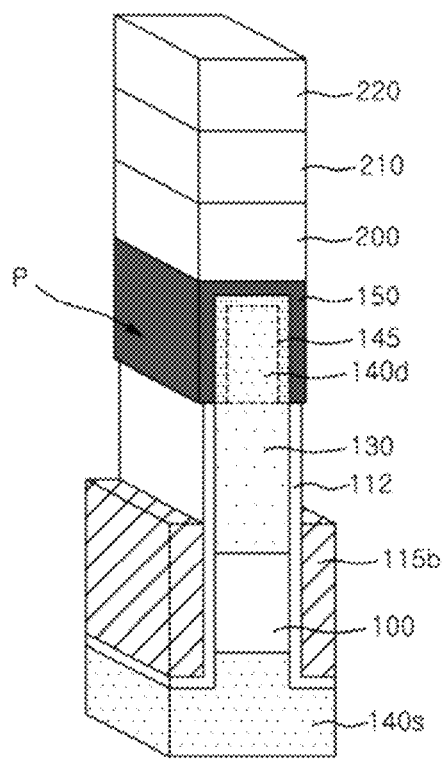
FIG. 12 is a perspective view illustrating an active pillar according to an embodiment.

Referring to FIG. 12, the silicide layer 150 is formed over a contour of the active pillar P. That is, the silicide layer 150 is formed to cover an upper surface of the active pillar P and upper sidewalls of the active pillar P. The gate electrodes 115b are formed over lower sidewalls of the active pillar P and are electrically insulated from the silicide layer 150. Then, a lower electrode 200, a variable resistance layer 210, and an upper electrode 220 are formed on the exposed silicide layer 150, and thus a variable resistive memory device is completed.

According to an embodiment, after an initial active region L is formed in a linear form, a gate electrode in a linear shape is formed on each of the sidewalls of the line-shaped active region L. A silicide layer is formed along a contour of an upper active region to cover an upper surface and sidewalls of the active region L. Thus, a silicide layer formation region is formed in a self-aligned manner without an additional etching process for forming the silicide formation region. Thus, the fabrication process of devices may be simplified and the process of forming the silicide layer is also simplified.

The above embodiments are illustrative and not limitative. Various alternatives are possible. The embodiments are not limited to configurations and shapes described herein. Nor are the embodiments limited to any specific type of semiconductor device.

What is claimed is:

1. A semiconductor integrated circuit device comprising:
an active line;
a drain region formed in an upper portion of the active line;
a common source region formed in a semiconductor substrate which is provided under the active line;
a gate electrode formed in a linear form over a lower sidewall of the active line;
a silicide layer extending from an upper surface of the drain region to a sidewall of the drain region; and
a contact ion region formed between the drain region and the silicide layer,
wherein the common source region extends from the semiconductor substrate under the active line to the semiconductor substrate under the neighboring active line, and
wherein the contact ion region has a higher impurity concentration than the drain region.

2. The semiconductor integrated circuit device of claim 1, wherein the gate electrode extends between the drain region and the common source region, and
wherein the gate electrode is spaced apart from the silicide layer and electrically insulated from the silicide layer.

3. The semiconductor integrated circuit device of claim 1, wherein a gate insulating layer is interposed between the gate electrode and the active line.

4. The semiconductor integrated circuit device of claim 1, wherein the silicide layer is located at a level higher than the gate electrode.

5. A semiconductor integrated circuit device comprising:
a semiconductor substrate;
a pair of active lines formed on the semiconductor substrate, wherein the pair of the active lines are formed to be parallel with each other with a space;

a drain region formed in an upper portion of each of the active lines;

a common source region formed in the semiconductor substrate under the pair of the active lines and under the space between the active lines;

a gate electrode formed in a linear form over a lower sidewall of each of the active lines;

a silicide layer extending from an upper surface of the drain region to a sidewall of the drain region;

a contact ion region formed between the drain region and the silicide layer, the contact ion region including a higher impurity concentration than the drain region; and a gap fill insulating layer formed in the common source region between the gate electrodes which are formed at sidewalls of different active lines.

6. A semiconductor integrated circuit device, comprising:

a semiconductor substrate;

an active pillar;

a gate electrode formed at sidewalls of the active pillar;

a drain region formed in an upper portion of the active pillar;

a source region formed in the semiconductor substrate under the active pillar;

a contact ion region formed along an upper surface and sidewalls of the drain region, the contact ion region including a higher impurity concentration than the drain region; and a silicide layer formed on the contact ion region, wherein the silicide layer is insulated from the gate electrode.

* * * * *